United States Patent [19]

Morigami

[11] Patent Number: 4,935,899
[45] Date of Patent: Jun. 19, 1990

[54] SEMICONDUCTOR MEMORY DEVICE WITH REDUNDANT MEMORY CELLS

[75] Inventor: Seiichi Morigami, Tokyo, Japan
[73] Assignee: NEC Corporation, Tokyo, Japan
[21] Appl. No.: 299,092
[22] Filed: Jan. 19, 1989
[30] Foreign Application Priority Data

Jan. 19, 1988 [JP] Japan .................................. 63-11362

[51] Int. Cl.⁵ ............................................... G11C 7/00
[52] U.S. Cl. .................................... 365/200; 365/225.7
[58] Field of Search ................ 365/200, 225.7, 230.06; 370/11

[56] References Cited

U.S. PATENT DOCUMENTS 4,720,817  1/1988  Childers ............................... 365/200
4,731,759  3/1988  Watanabe ............................ 365/200

*Primary Examiner*—Joseph A. Popek
*Attorney, Agent, or Firm*—Sughrue, Mion, Zinn, Macpeak & Seas

[57] ABSTRACT

In a semiconductor memory device with a redundant memory cell array provided in association with a memory cell array partially replaceable with the redundant memory cells, each programming circuit has a conduction path flowing a current in the absence of a defective memory cell for shifting a redundant memory controller into an inactive state, a redundant memory activation circuit produces an enable signal in the presence of the detective memory cell for shifting the controller into an active state and further produces a disenable signal in the absence of the defective memory cell, and a blocking transistor is provided in the conduction path and responsive to the disenable signal to block the conduction path, thereby causing the amount of current consumed to be decreased.

10 Claims, 6 Drawing Sheets

PRIOR-ART

PRIOR-ART

PRIOR-ART

SEMICONDUCTOR MEMORY DEVICE WITH REDUNDANT MEMORY CELLS

FIELD OF THE INVENTION

This invention relates to a semiconductor memory device and, more particularly, to a controlling circuit provided for redundant memory cells incorporated in the semiconductor memory device.

BACKGROUND OF THE INVENTION

A typical example of the semiconductor memory device is illustrated in FIG. 1 and largely comprises a memory cell array 1 regularly used for memorization of pieces of data information, an addressing unit 2 supplied with a multi-bit address signal AD from the outside thereof for specifying one of the memory cells, a control signal producing circuit 3 supplied with various external control signals such as, for example, a chip select signal S1 of an active low voltage level for producing internal control signals, a redundant memory cell row 4 provided with a plurality of redundant memory cells replacable with any memory cell row incorporated in the memory cell array, and a controller 5 provided in association with the redundant memory cell row 4.

The addressing unit 2 has an address buffer circuit 6 to which the multi-bit address signal AD is supplied, and the address buffer circuit 6 is operative to distribute the multi-bits of the address signal AD to a row address decoder circuit 7 and a column address decoder circuit 8. The controller 5 is provided with a redundant memory activation circuit 9, a plurality of programming circuits 10 to 11 and an AND gate 12. The redundant memory activation circuit 9 and the programming circuits 10 to 11 are supplied with a delayed chip select signal S1' produced by the control signal producing circuit 3 for activations thereof, and the address bits $ax_i$ and $\overline{ax_i}$ distributed to the row address decoder circuit 7 are supplied in parallel to the programming circuits 10 to 11, respectively, to decide whether or not one of the memory cell rows replaced with the redundant memory cell row is selected for access. The AND gate 12 provides the redundant memory cell row 4 a activation signal for the activation thereof, and the activation signal is further supplied to the row address decoder circuit for restriction of the memory cell row replaced with the redundant memory cell row 4.

Turning to FIG. 2 of the drawings, there is shown the detailed circuit arrangement of each programming circuit which comprises a series of a fuse element 21, a p-channel type field effect transistor 22 and an n-channel type field effect transistor 23 coupled between a source of positive voltage level Vcc and a ground terminal, a flip-flop circuit 24 and an activation circuit 25. The delayed chip select signal S1' is supplied to the gate electrode of the p-channel type field effect transistor 22 for switching operation, but the n-channel type field effect transistor 23 has the gate electrode coupled to the source of positive voltage level Vcc for serving as a resistor. When a defective memory cell is detected during a diagnostic operation, the fuse element 21 is destroyed with a laser beam.

The series combination has an output node 26 between the field effect transistors 22 and 23, and the output node 26 is connected to the input node of a CMOS inverter circuit 27 coupled between the source of positive voltage Vcc and the ground terminal. Between the output node 26 and the ground terminal is coupled an n-channel type field effect transistor 28 the gate electrode of which is coupled to the output node of the CMOS inverter circuit 27. The flip-flop circuit 24 thus arranged produces a replacing signal of the high voltage level at all times in the presence of the low voltage level at the output node 26 when the fuse element is destroyed. The replacing signal is fixed to the low voltage level, because the field effect transistor 28 turns on with the replacing signal of the high voltage level. However, if no destruction takes place in the fuse element 21, the p-channel type field effect transistor 22 is shifted between the high voltage level and the low voltage level depending upon the delayed chip select signal S1'. Namely, while the delayed chip select signal remains in the inactive high voltage level, the p-channel type field effect transistor 22 turns off to block a conduction path between the fuse element 21 and the output node 26, then the output node 26 remains in the low voltage level which in turn causes the CMOS inverter circuit 27 to shift the replacing signal to the high voltage level. On the other hand, if the delayed chip select signal S1' is shifted to the active low voltage level, the p-channel type field effect transistor 22 turns on to provide the conduction path between the fuse element 21 and the output node 26, then the output node 26 goes up to the high voltage level which allows the CMOS inverter circuit to shift the selection signal to the low voltage level.

The activation circuit 25 comprises an inverter circuit 29 and a series combination of transfer gates 30 and 31 coupled between two nodes to which the bit of the address signal $ax_i$ and the inverse thereof are respectively supplied. Since the replacing signal is supplied to the inverter circuit 29, the inverse of the replacing signal is produced by the inverter circuit 29. The replacing signal and the inverse thereof are supplied in parallel to the transfer gates 30 and 31. Then, the activation circuit 25 is responsive to the replacing signal and produces a selection signal identical in level with the bit $ax_i$ of the address signal of the active high voltage level in the presence of the replacing signal of the high voltage level. However, the inverse of the address bit $ax_i$ is transferred to the AND gate 12 if the replacing signal remains in the low voltage level.

The redundant memory activation circuit 9 is provided with a series combination of a fuse element 32, a p-channel type field effect transistor 33 and an n-channel type field effect transistor 34 coupled between the source of positive voltage level Vcc and the ground terminal as shown in FIG. 3, and a flip-flop circuit 35, and the flip-flop circuit 35 has a CMOS inverter circuit 36 coupled between the source of positive voltage level Vcc and the ground terminal and an n-channel type field effect transistor 37 coupled between an output node 38 of the series combination and the ground terminal.

The fuse element 32 is destroyed with the laser beam upon detection of the defective memory cell, and, for this reason, the output node 38 is fixed to the low voltage level regardless of the delayed chip select signal S1'. If the output node 38 is fixed to the low voltage level, the flip-flop circuit 35 produces an enable signal of the high voltage level at all times. However, when the fuse element 32 provides a conduction path between the source of positive voltage level Vcc and the p-channel type field effect transistor 33, the production of the enable signal depends upon the delayed chip select signal. Namely, when the delayed chip select signal S1' remains in the inactive high voltage level, the output node 38 is in the low voltage level due to the p-channel type field effect transistor 72 in the off state, then the CMOS inverter circuit 36 produces the enable signal, however, no data bit is read out from the semiconductor memory device due to the inactivated state. On the other hand, when the delayed chip select signal S1' goes down to the active low voltage level, the out put node 38 goes up to the high voltage level, then no enable signal is produced by the flip-flop circuit 35.

Turning back to FIG. 1 of the drawings, description is made for the replacement of the defective memory cell row with the redundant memory cell row 4. As described above, when the defective memory cell is detected, the fuse elements 21 and 32 are destroyed for replacement of the defective memory cell with the redundant memory cell. Then, the redundant memory activation circuit 9 produces the enable signal which is supplied to the AND gate 12. In this situation, if the address signal AD specifies the defective memory cell, all of the programming circuits 10 to 11 produces the selection signals of the high voltage level, respectively, which in turn are supplied to the AND gate 12. Then, the AND gate 12 produces the activation signal of the active high voltage level for activation of the redundant memory cell row 4. The activation signal is also supplied to the row address decoder circuit 7 for restricting the activation of the memory cell row, and, for this reason, no data bit is read out from the defective memory cell. However, the address signal AD does not specify the defective memory cell, at least one of the selection signals remains in the inactive low voltage level, then no activation signal is produced by the AND gate 12.

A problem is encountered in the prior-art semiconductor memory device in a large amount of current consumed therein. This is because of the fact that a conduction path is established in each series combination of the fuse element 21 or 32, the p-channel type field effect transistor 22 or 33 and the n-channel type field effect transistor 23 or 34 of the semiconductor memory device without any defective memory cell in the presence of the delayed chip select signal S1' of the active low voltage level. If a large number of the programming circuits are provided to cope with a high integration density which is one of the current tendencies in the semiconductor manufacturers, the problem becomes more serious.

Another semiconductor memory device is disclosed in U.S. Pat. No. 4,639,895, and a redundancy technique is employed in this semiconductor memory device.

SUMMARY OF THE INVENTION

It is therefore an important object of the present invention to provide a semiconductor memory device which is improved in current consumption even if no redundant memory cells is used.

To accomplish these objects, the present invention proposes to produce a disenable signal in the absence of a defective memory cell for blocking the conduction paths in the programming circuits.

In accordance with the present invention, there is provided a semiconductor memory device responsive to an external control signal for an activation thereof, comprising: memory cell array having a plurality of memory cells each used for memorizing a data bit in so far as a perfect memory cell, each of the memory cells having a possibility of a defective memory cell; an addressing unit responsive to an external address signal in the presence of the external control signal and operative to specify one of the memory cells for an access; a redundant memory cell group used for memorizing the data bits instead of a part of the memory cell array with the defective memory cells; and a redundant memory controller shifted between an inactive state and an active state and operative to cause the part of the memory cell array to be replaced with the redundant memory cell group when one of the defective cells is specified by the addressing unit in the active state, wherein the redundant memory controller comprises programming means having a plurality of conduction paths between two voltage sources different in voltage level in the absence of the defective memory cell for shifting the redundant memory controller into the inactive state, the conduction paths being blocked in the presence of the defective memory cell for shifting the redundant memory controller into the active state, the programming means being operative to detect the access to the defective memory cell for producing a selection signal, redundant memory activation means operative to memorize the presence of the defective memory cells for producing an enable signal, the redundant memory activation means further being operative to produce a disenable signal on the basis of the external control signal in the absence of the defective memory cell, logic gate means responsive to the selection signal in the presence of the enable signal and operative to replace the defective memory cells with the part of the memory cell array, and blocking means responsive to the disenable signal in the presence of the external control signal and operative to block the conduction paths when the redundant memory controller is shifted into the inactive state.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First embodiment

Figure 1:
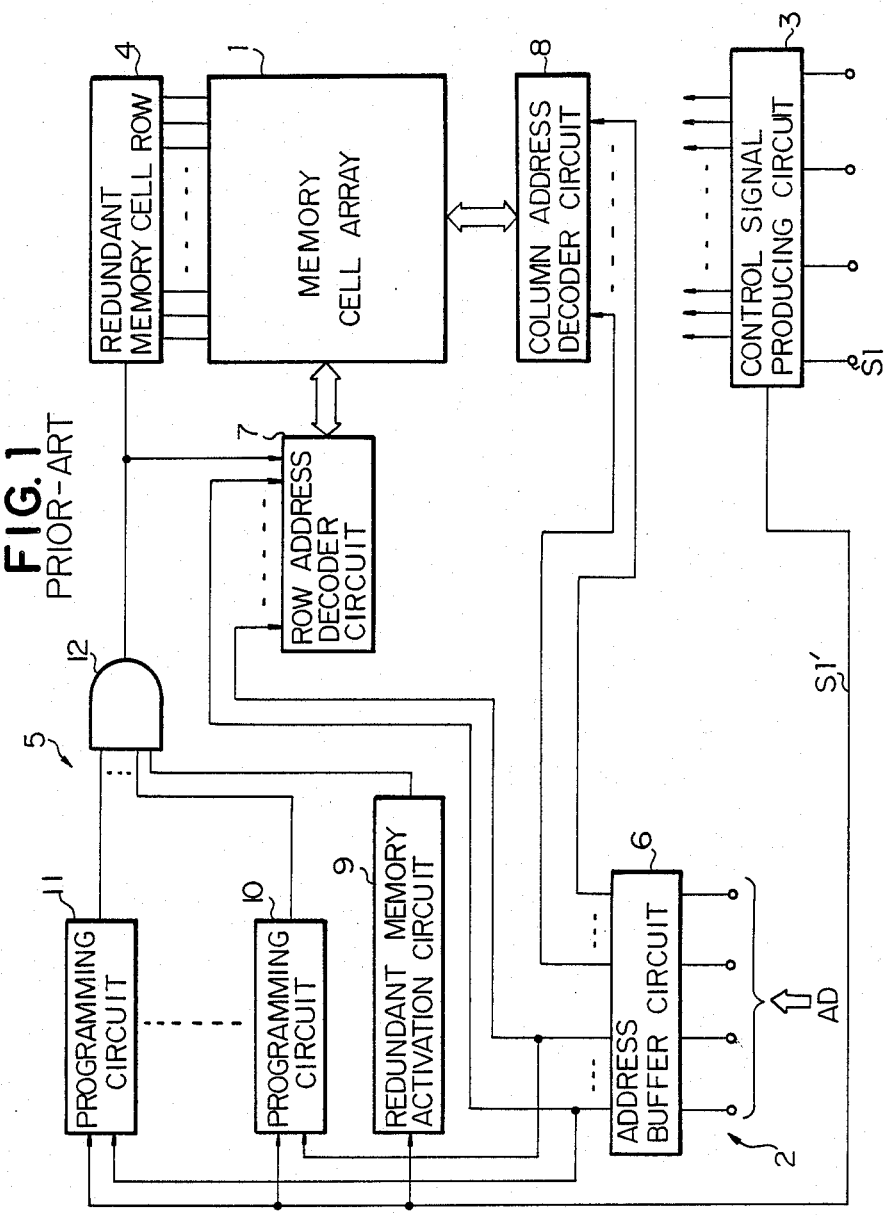
FIG. 1 is a block diagram showing the arrangement of a prior-art semiconductor memory device with a redundant memory cell row.
Figure 2:
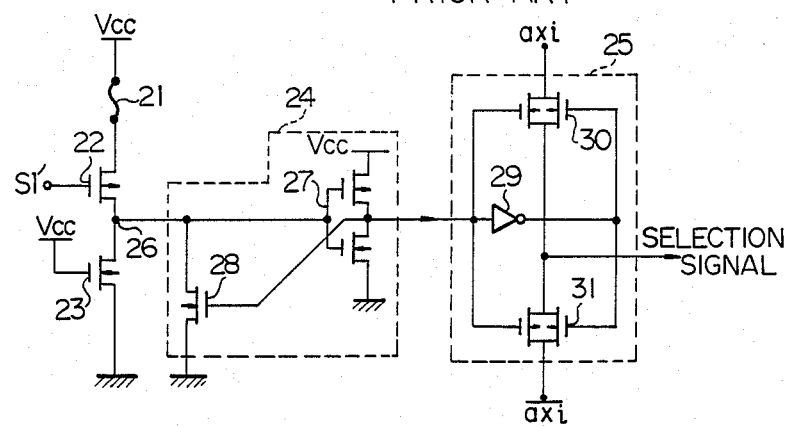
FIG. 2 is a circuit diagram showing the arrangement of the programming circuit incorporated in the prior-art semiconductor memory device.
Figure 3:
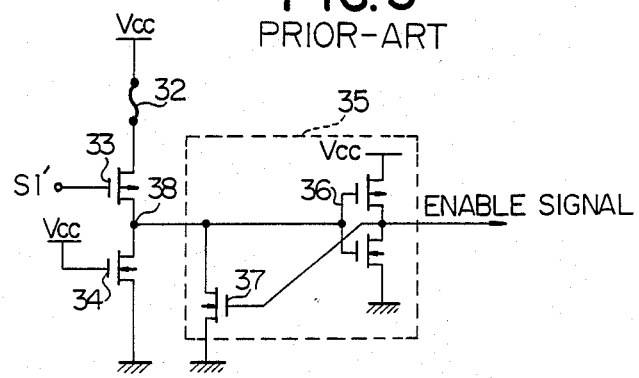
FIG. 3 is a circuit diagram showing the arrangement of the redundant memory activation circuit incorporated in the prior-art semiconductor memory device.
Figure 4:
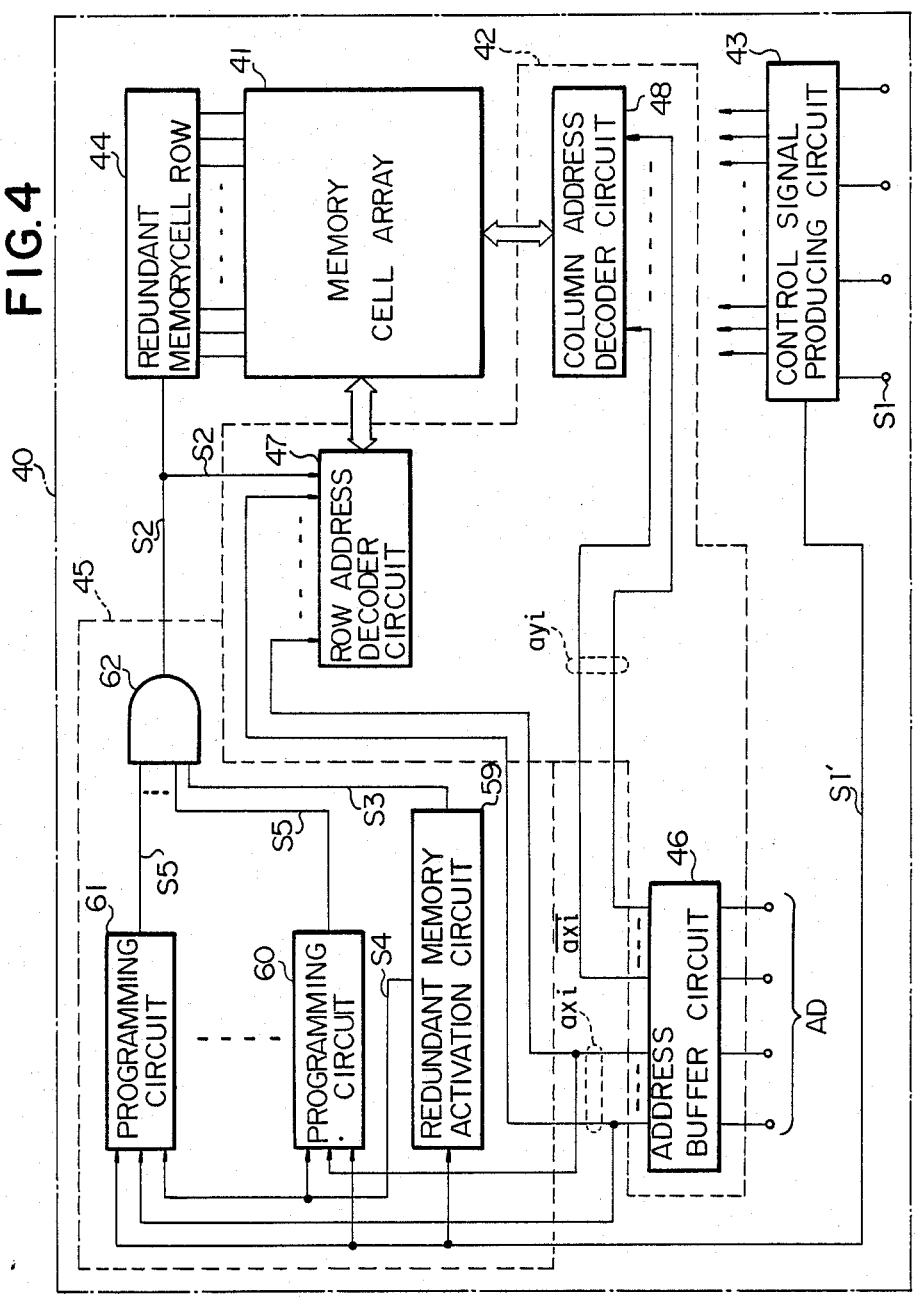
FIG. 4 is a block diagram showing the arrangement of a semiconductor memory device embodying the present invention.

Referring first to FIG. 4 of the drawings, a semiconductor memory device embodying the present invention is illustrated and fabricated on a semiconductor substrate 40. The semiconductor memory device shown in FIG. 4 largely comprises a memory cell array 41 provided with a plurality of memory cells which are regularly used for memorization of pieces of data information, an addressing unit 42 supplied with a multi-bit address signal AD from the outside thereof for specifying one of the memory cells, a control signal producing circuit 43 supplied with various external control signals such as, for example, a chip select signal S1 of an active low voltage level for producing internal control signals, a redundant memory cell row 44 provided with a plurality of redundant memory cells replacable with any memory cell row incorporated in the memory cell array 41, and a redundant memory cell controller 45 provided in association with the redundant memory cell row 44. As suggested by the word "array", the memory cells are arranged in rows and columns, and the memory cells in each row and the memory cells in each column are hereinunder referred to as "memory cell row" and "memory cell column", respectively, for the sake of simplicity.

The addressing unit 42 has an address buffer circuit 46 to which the multi-bit address signal AD is supplied, and the multibit address signal has plural address bits $ay_i$ and $\overline{ay}_i$ for a column address and plural address bits $ax_i$ and $\overline{ax}_i$ for a row address. The address buffer circuit 46 is operative to distribute the multi-bits of the address signal AD to a row address decoder circuit 47 and a column address decoder circuit 48. Namely, the plural address bits $ay_i$ and $\overline{ay}_i$ are supplied to the column address decoder circuit 48 for selecting one of the memory cell column, and the plural address bits $ax_i$ and $\overline{ax}_i$ are supplied to the row address decoder circuit 47 for activation of one of the memory cell row. An activation signal S2 is supplied from the redundant memory controller 45 to the row address decoder circuit 47 for restricting the activation of the memory cell row, and the activation signal S2 is hereinunder described in detail.

The redundant memory cell controller 45 is provided with a redundant memory activation circuit 59, a plurality of programming circuits 60 to 61 and an AND gate 62. The redundant memory activation circuit 59 and the programming circuits 60 to 61 are supplied with a delayed chip select signal S1' produced by the control signal producing circuit 43 for activations thereof, and the address bits $ax_i$ and $\overline{ax}_i$ are supplied in parallel to the programming circuits 60 to 61, respectively, to decide whether or not one of the memory cell rows replaced with the redundant memory cell row is specified for access. The redundant memory activation circuit 59 is operative to produce an enable signal S3 and a disenable signal S4, and each of the programming circuits 60 to 61 is operative to produce an activation signal S5. The enable signal S3 and all of the activation signals S5 are supplied to the AND gate 62 for producing the activation signal S2. However, the disenable signal S4 is supplied in parallel from the redundant memory activation circuit 59 to all of the programming circuits 60 to 61 for restricting the production of the activating signals S5, and the disenable signal S4 characterizes the semiconductor memory device according to the present invention. The AND gate 62 provides the redundant memory cell row 44 the activation signal S2 for the activation thereof as well as the row address decoder circuit 47 as in the similar manner to the prior-art semiconductor memory device.

Figure 5:
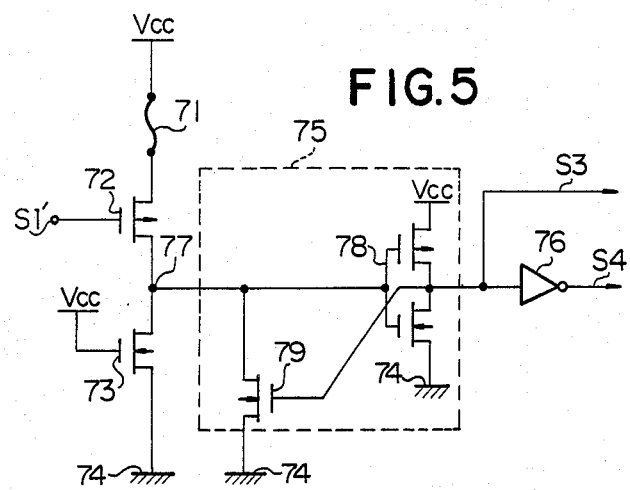
FIG. 5 is a circuit diagram showing the arrangement of a redundant memory activation circuit incorporated in the semiconductor memory device shown in FIG. 4.

Turning to FIG. 5 of the drawings, the circuit arrangement of the redundant memory activation circuit 59 is illustrated in detail. The redundant memory activation circuit 59 is provided with a series combination of a fuse element 71, a p-channel type field effect transistor 72 and an n-channel type field effect transistor 73 coupled between a source of positive voltage level Vcc and a ground terminal 74, a flip-flop circuit 75, and an inverter circuit 76. The p-channel type field effect transistor 72 has a gate electrode supplied with the delayed chip select signal S1', and the source of positive voltage level Vcc is coupled to a gate electrode of the n-channel type field effect transistor 73 for providing a certain resistance to a current flowing therethrough. Between the p-channel type field effect transistor 72 and the n-channel type field effect transistor 73 is provided an output node 77 which is connected to the common gate electrode of a CMOS inverter circuit 78 coupled between the source of positive voltage level Vcc and the ground terminal 74. The flip-flop circuit 75 further has an n-channel type field effect transistor 79 coupled between the output node 77 and the ground terminal 74, and a gate electrode of the n-channel type field effect transistor 79 is coupled to an output node of the CMOS inverter circuit 78. The output node of the CMOS inverter circuit 78 is coupled in parallel to one of the input nodes of the AND gate 62 and the inverter circuit 76, and, for this reason, the flip-flop circuit 75 produces the enable signal S3 depending upon the voltage level at the output node 77. On the other hand, the disenable signal S4 is produced by the inverter circuit 76 as the inverse of the enable signal S3. The fuse element 71 is destroyed with a laser beam when a detective memory cell is detected in a diagnostic operation, however, no destruction takes place with the decision of no defective memory cell.

If the fuse element 71 is destroyed with the laser beam upon detection of the defective memory cell, the output node 77 is fixed to the low voltage level regardless of the delayed chip select signal S1', because no current is supplied to the output node 77. The output node 77 is thus fixed to the low voltage level, then the flip-flop circuit 75 produces the enable signal S3 of the high voltage level at all times due to a current supplied from the source of positive voltage level Vcc through the CMOS inverter circuit 75.

However, if the fuse element 71 provides the conduction path, the redundant memory activation circuit 59 is responsive to the delayed chip select signal S1'. Namely, if the delayed chip select signal S1' remains in the inactive high voltage level, the p-channel type field effect transistor 72 turns off to allow the output node 77 to go down to the low voltage level. With the low voltage level, the CMOS inverter circuit 75 produces the enable signal of the active high voltage level, however, no access takes place to the redundant memory cell due to the inactivated state of the semiconductor memory device. However, when the delayed chip select signal S1' goes down to the active low voltage level, the p-channel type field effect transistor 72 turns on to allow the output node 77 to go up to the high voltage level, then the CMOS inverter circuit 78 does not produce the enable signal of the active high voltage level, however, the disenable signal S4 of the high voltage level is produced by the inverter circuit 76.

Figure 6:
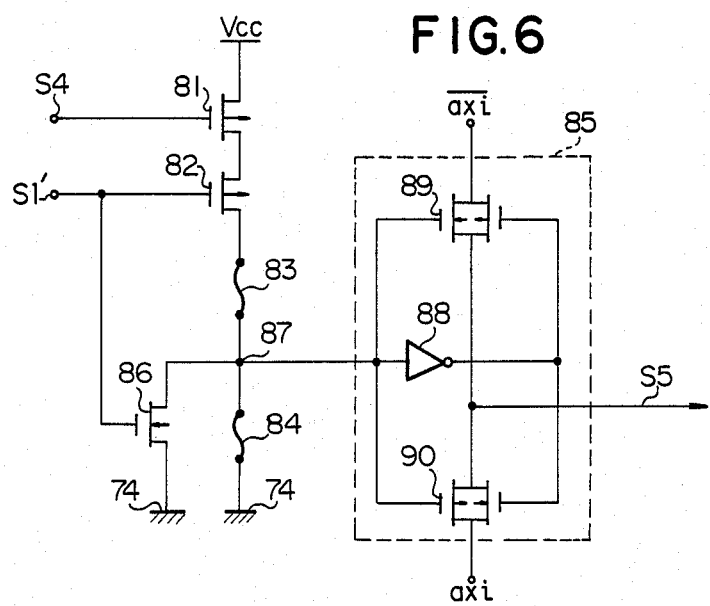
FIG. 6 is a circuit diagram showing the arrangement of a programming circuit incorporated in the semiconductor memory device shown in FIG. 4.

Turning to FIG. 6 of the drawings, each of the programming circuit 60 to 61 is provided with a series combination of p-channel type field effect transistors 81 and 82 and fuse elements 83 and 84 coupled between the source of positive voltage level Vcc and the ground terminal 74, an activation circuit 85 provided between two nodes where one of the address bits $ax_i$ and the inverse thereof are supplied, and an n-channel type field effect transistor 86 coupled between an output node 87 between the fuse elements 83 and 84 and the ground terminal 74. The disenable signal S4 is supplied to a gate electrode of the p-channel type field effect transistor 81, and the delayed chip select signal S1' is supplied in parallel to respective gate electrodes of the field effect transistors 82 and 86. The activation circuit 85 has an inverter circuit 88 coupled to the output node 87 and two transfer gates 89 and 90, and both of the transfer gates 89 and 90 are coupled to not only the output node 87 but also the inverter circuit 88. When a defective memory cell is detected during the diagnostic operation, the fuse element 83 is destroyed in so far as the address bit $ax_i$ allows to be in the high voltage level due to the external address signal AD. However, if the inverse of the address bit goes up to the high voltage level on the basis of the external address signal AD, the fuse element 84 will be melted away instead of the fuse element 83. However, description will be made on the assumption that the address bit $ax_i$ goes up to the high voltage level upon being specified by the external address signal AD.

In accordance with the above assumption, the fuse element 83 is melted away upon detection of the defective memory cell, and, accordingly, the output node 87 is fixed to the low voltage level regardless of the delayed chip select signal S1'. With the low voltage level at the output node 87, the transfer gate 90 turns on in the presence of the address bit $ax_i$ of the high voltage level, however, the transfer gate 90 remains in the off-state, thereby producing the activation signal S5 of the high voltage level. However, when the address bit $ax_i$ remains in the low voltage level due to accessing to a data bit stored in a non-defective memory cell, no activation signal S5 is produced, because the transfer gate 89 keeps off at all times.

If no detective memory cell is detected in the diagnostic operation, the fuse elements 83 and 84 provide conduction paths from the source of positive voltage level Vcc and the ground terminal 74 to the output node 87, respectively. In this situation, when the delayed chip select signal S1' is in the inactive high voltage level, the n-channel type field effect transistor 86 turns on to cause the output node 87 to fix in the low voltage level, but the p-channel type field effect transistor 82 is turned off to block the current from the source of positive voltage level Vcc. On the other hand, if the delayed chip select signal S1' is shifted to the active low voltage level, the p-channel type field effect transistor 82 turns on, but the −channel type field effect transistor 81 turns off to block the conduction path from the source of positive voltage level Vcc, because the redundant memory activation circuit 59 produces the disenable signal S4 of the high voltage level. As a result, no current flows from the source of the positive voltage level Vcc to the ground terminal 74 regardless of the delayed chip select signal S1'.

Turning back to FIG. 4 of the drawings, as described above, when the defective memory cell is detected, the fuse elements 71 and 83 are destroyed for replacement of the defective memory cell row with the redundant memory cell row 44. Then, the redundant memory activation circuit 59 produces the enable signal S3 which is supplied to the AND gate 62. In this situation, if the address signal AD specifies the defective memory cell, all of the programming circuits 60 to 61 produces the activation signals S5 of the high voltage level, respectively, which are supplied to the AND gate 62. Then, the AND gate 62 produces the activation signal S2 of the active high voltage level for activation of the redundant memory cell row 44. However, the address signal AD does not specify the defective memory cell row, at least one of the activation signals S5 remains in the inactive low voltage level, and, for this reason, no activation signal is produced by the AND gate 62.

Second embodiment

Figure 7:
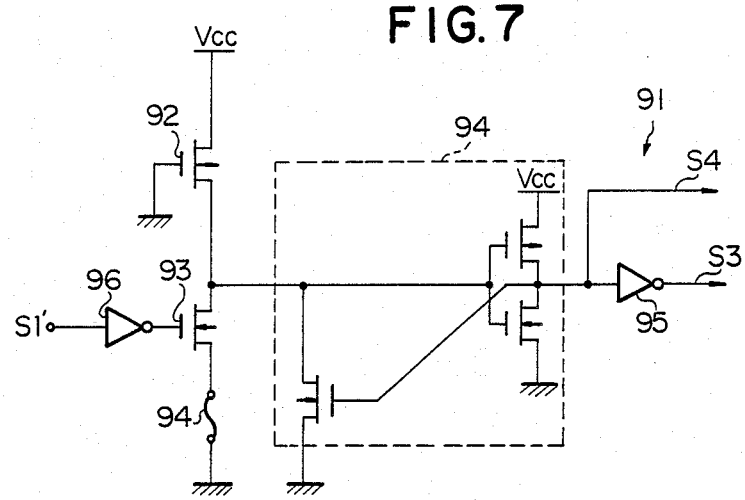
FIG. 7 is a circuit diagram showing the arrangement of a programming circuit incorporated in another semiconductor memory device embodying the present invention.

Turning to FIG. 7 of the drawings, the circuit arrangement of a redundant memory activation circuit 91 is illustrated. The redundant memory activation circuit 91 is incorporated in another semiconductor memory device embodying the present invention which is similar in circuit arrangement to the semiconductor memory device shown in FIG. 4 except for the redundant memory activation circuit 91. For this reason, description is made for the redundant memory activation circuit 91 only.

The circuit 91 comprises a series combination of a p-channel type field effect transistor 92, an n-channel type field effect transistor 93 and a fuse element 94 coupled between the source of positive voltage level Vcc and the ground terminal, a flip-flop circuit 94 and two inverter circuits 95 and 96.

In operation, when a defective memory cell is detected, the fuse element 94 is melted away, then a low voltage level is supplied from the flip-flop circuit 94 to the inverter circuit 95, thereby causing the inverter circuit 95 to produce the enable signal S3 of the active high voltage level. However, if no defective memory cell is found in the diagnostic operation, the fuse element 94 provides the conduction path between the source of positive voltage level Vcc and the ground terminal. For this reason, the flip-flop circuit 94 produces the disenable signal S4 as well as the enable signal S3 depending upon the delayed chip select signal S1'. Namely, when the delayed chip select signal S1' goes down to the active low voltage level, the n-channel type field effect transistor 93 turns on with the inverse of the delayed chip select signal, then the flip-flop circuit 94 produces the disenable signal of the high voltage level which blocks the conduction path in the series combination of the programming circuit.

Third embodiment

Figure 8:
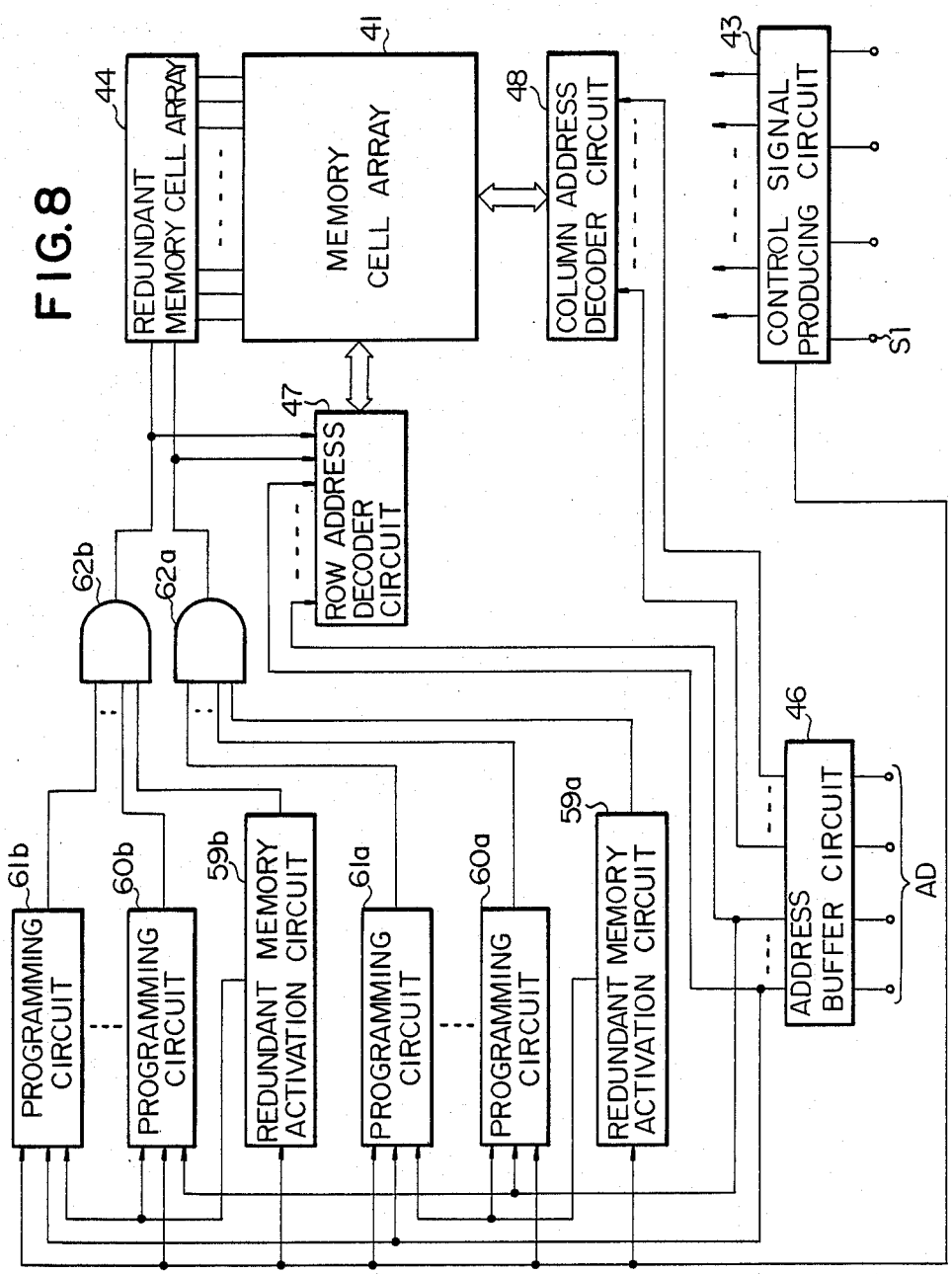
FIG. 8 is a block diagram showing the arrangement of still another semiconductor memory device embodying the present invention.

Turning to FIG. 8, there is shown the arrangement of still another semiconductor memory device embodying the present invention. The semiconductor memory device shown in FIG. 8 has a redundant memory cell array with two redundant memory cell rows, and, for this reason, the redundant memory controller 45 is duplicated for selectively activating the redundant memory cell rows. However, each circuit is similar in circuit arrangement to those of the semiconductor memory device shown in FIG. 4, and, for this reason, circuits are denoted by like reference numerals designating the corresponding circuits shown in FIG. 4 except for the redundant memory controller. In order to describe the duplicated redundant memory activation circuit, the component circuits are grouped by the redundant memory cell rows and designated by like reference numerals with letters a and b.

Although particular embodiments of the present invention have been shown and described, it will be obvious to those skilled in the art that various changes and modifications may be made without departing from the spirit and scope of the present invention.

What is claimed is:

1. A semiconductor memory device responsive to an external control signal for an activation thereof, comprising:

(a) memory cell array having a plurality of memory cells each used for memorizing a data bit in so far as each of the memory cells is of a perfect memory cell, each of said memory cells having a possibility of a defective memory cell;

(b) an addressing unit responsive to an external address signal in the presence of said external control signal and operative to specify one of the memory cells for an access;

(c) a redundant memory cell group used for memorizing the data bits if a part of said memory cell array has said defective memory cells; and (d) a redundant memory controller shifted between an inactive state and an active state and operative to cause the part of said memory cell array to be replaced with said redundant memory cell group when one of the defective cells is specified by said addressing unit in the active state, wherein said redundant memory controller comprises (d-1) programming means having a plurality of conduction paths between two voltage sources different in voltage level in the absence of the defective memory cell for shifting said redundant memory controller into said inactive state, said conduction paths being blocked in the presence of the defective memory cell for shifting said redundant memory controller into said active state, said programming means being operative to detect the access to the defective memory cell for producing a selection signal, (d-2) redundant memory activation means for producing an enable signal representative of the existence of said defective memory cells, said redundant memory activation means further being operative to produce a disenable signal in the absence of the defective memory cell when said external control signal is supplied to said semiconductor memory device, (d-3) logic gate means responsive to the selection signal in the presence of the enable signal and operative to replace the part of said memory cell array with said redundant memory cell group, and (d-4) blocking means responsive to said disenable signal in the presence of said external control signal and operative to block said conduction paths when the redundant memory controller is shifted into the inactive state.

2. A semiconductor memory device as set forth in claim 1, in which said redundant memory cell group is arranged into a single row and in which said redundant memory activation means and said logic gate means are respectively formed by a redundant memory activation circuit and a logic gate.

3. A semiconductor memory device as set forth in claim 2, in which said redundant memory activation circuit is provided with a first series combination of a first fuse element, a first p-channel type field effect transistor gated by the external control signal, an output node and a first load transistor coupled between said two voltage sources, a first flip-flop circuit having an input node coupled to the output node of the first series combination for producing said enable signal, and a first inverter circuit supplied with the enable signal for producing said disenable signal.

4. A semiconductor memory device as set forth in claim 3, in which said first flip-flop circuit has a first complementary inverter circuit coupled between said two voltage sources and having an input node coupled to the output node of said first series combination and a first n-channel type field effect transistor coupled between the output node of the first series combination and one of said two voltage sources and having a gate electrode coupled to an output node of the first complementary inverter circuit.

5. A semiconductor memory device as set forth in claim 3, in which said addressing unit produces address bits and the inverse bits thereof paired with the address bits, respectively, for supplying said programming means therewith.

6. A semiconductor memory device as set forth in claim 5, in which said programming means comprises a plurality of programming circuits each having a second series combination of second and third fuse elements and second and third p-channel type field effect transistors gated by said disenable signal and said external control signal, respectively, a third series combination of first and second transfer gates coupled between first and second nodes to which one of said address bits and the inverse thereof are respectively supplied, and a second inverter circuit coupled at the input node thereof to an output node of the second series combination provided between the second and third fuse elements, the output node of the second series combination and the second inverter circuit being coupled in parallel to the first and second transfer gates.

7. A semiconductor memory device as set forth in claim 6, in which said logic gate is formed by an AND gate.

8. A semiconductor memory device as set forth in claim 2, in which said redundant memory activation circuit has a fourth series combination of a second load transistor, an output node thereof, a second n-channel type field effect transistor and a fourth fuse element coupled between said two voltage sources, a second flip-flop circuit coupled at an input node thereof to the output node of the fourth series combination for producing said disenable signal, a third inverter circuit supplied with said external control signal for supplying a gate electrode of the second n-channel type field effect transistor with the inverse of the external control signal, and a fourth inverter circuit coupled at the input node thereof to an output node of the second flip-flop circuit for producing said enable signal.

9. A semiconductor memory device as set forth in claim 1, in which said semiconductor memory device further comprises another redundant memory cell group and in which said redundant memory activation means and said logic gate means are respectively formed by a plurality of redundant memory activation circuits and a plurality of logic gates both provided in association with the redundant memory cell groups, respectively.

10. A semiconductor memory device responsive to an external control signal for an activation thereof, comprising:
(a) memory cell array having a plurality of memory cells each used for memorizing a data bit in so far as each of the memory cells is of a perfect memory cell, each of said memory cells having a possibility of a defective memory cell;
(b) an addressing unit responsive to an external address signal in the presence of said external control signal and operative to specify one of the memory cells for an access, said addressing unit producing address bits and the inverse bits thereof paired with the address bits, respectively;
(c) a redundant memory cell group used for memorizing the data bits if a part of said memory cell array has said defective memory cells; and
(d) a redundant memory controller shifted between an inactive state and an active state and operative to cause the part of said memory cell array to be replaced with said redundant memory cell group when one of the defective cells is specified by said addressing unit in the active state, wherein said redundant memory controller comprises
(d-1) a redundant memory activation circuit having a first series combination of a first fuse element, a first p-channel type field effect transistor gated by the external control signal, an output node and a first load transistor coupled between two voltage sources different in voltage level, a first flip-flop circuit having an input node coupled to the output node of the first series combination for producing an enable signal, and a first inverter circuit supplied with the enable signal for producing a disenable signal, said first flip-flop circuit having a first complementary inverter circuit coupled between said two voltage sources and having an input node coupled to the output node of said first series combination and a first n-channel type field effect transistor coupled between the output node of the first series combination and one of said two voltage sources and having a gate electrode coupled to an output node of the first complementary inverter circuit,
(d-2) programming means including a plurality of programming circuits and operative to detect the access to the defective memory cell for producing a selection signal in the presence of said enable signal, each programming circuit having a second series combination of second and third fuse elements and second and third p-channel type field effect transistors gated by said disenable signal and said external control signal, respectively, a third series combination of first and second transfer gates coupled between first and second nodes to which one of said address bits and the inverse thereof are respectively supplied, and a second inverter circuit coupled at the input node thereof to an output node of the second series combination provided between the second and third fuse elements, said second series combination being coupled between said two voltage sources different in voltage level, the output node of the second series combination and the second inverter circuit being coupled in parallel to the first and second transfer gates,
(d-3) an AND gate responsive to said selection signal and operative to replace the part of said memory cell array with said redundant memory cell group, and
(d-4) blocking means responsive to said disenable signal in the presence of said external control signal and operative to block said conduction paths when the redundant memory controller is shifted into the inactive state.

* * * * *